(12) United States Patent
Huang

(10) Patent No.: US 11,196,017 B2
(45) Date of Patent: Dec. 7, 2021

(54) DISPLAY HAVING A BLUNT STRUCTURE

(71) Applicant: Wuhan China Star Optoelectronics Semiconductor Display Technology Co., Ltd., Hubei (CN)

(72) Inventor: Wei Huang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/895,189

(22) Filed: Jun. 8, 2020

(65) Prior Publication Data
US 2021/0202893 A1 Jul. 1, 2021

(30) Foreign Application Priority Data
Dec. 27, 2019 (CN) .......................... 201911375654.1

(51) Int. Cl.
*H01L 51/00* (2006.01)
*H01L 51/52* (2006.01)
*H01L 27/32* (2006.01)

(52) U.S. Cl.
CPC ........ *H01L 51/5237* (2013.01); *H01L 27/323* (2013.01); *H01L 51/0097* (2013.01); *H01L 51/5281* (2013.01); *H01L 2251/5338* (2013.01)

(58) Field of Classification Search
CPC ............. H01L 51/5237; H01L 51/0097; H01L 51/5281; H01L 27/323; H01L 2251/5338
See application file for complete search history.

(56) References Cited

U.S. PATENT DOCUMENTS

| | | | | |
|---|---|---|---|---|
| 6,597,416 B1 * | 7/2003 | Momose | ............. | G02F 1/13452 349/149 |
| 7,545,649 B2 * | 6/2009 | Tan | ......... | H05K 1/028 174/254 |
| 7,593,234 B2 * | 9/2009 | Okuda | ................ | G02F 1/13452 361/749 |
| 7,683,476 B2 * | 3/2010 | Lee | ..................... | H01L 23/4985 257/723 |
| 9,177,904 B2 * | 11/2015 | Jung | ..................... | H01L 27/323 |
| 9,195,108 B2 * | 11/2015 | Park | ....................... | H01L 27/124 |
| 9,207,477 B2 * | 12/2015 | Miyazaki | ............ | G02F 1/13336 |
| 9,823,770 B2 * | 11/2017 | Lee | ....................... | G06F 3/0416 |
| 10,204,846 B2 * | 2/2019 | Kim | ..................... | H01L 27/3276 |
| 10,409,096 B2 * | 9/2019 | Odaka | ................. | H01L 51/0097 |
| 10,559,766 B2 * | 2/2020 | Zhai | ..................... | H01L 27/3246 |
| 10,658,436 B2 * | 5/2020 | Shin | ........................ | H01L 51/56 |
| 2018/0204901 A1 * | 7/2018 | Hwang | ............... | H01L 27/3276 |
| 2018/0233552 A1 * | 8/2018 | Lee | ..................... | H01L 51/5253 |
| 2018/0375044 A1 * | 12/2018 | Sasabayashi | ....... | H01L 27/1218 |
| 2020/0152892 A1 * | 5/2020 | Kim | ..................... | H01L 51/0097 |
| 2020/0266261 A1 * | 8/2020 | Xu | ........................ | H01L 27/3276 |
| 2020/0302842 A1 * | 9/2020 | Lee | ..................... | H01L 51/0097 |
| 2020/0333653 A1 * | 10/2020 | Araki | ..................... | G06F 1/1656 |
| 2021/0168230 A1 * | 6/2021 | Baker | ................. | H04M 1/0202 |

* cited by examiner

*Primary Examiner* — Ida M Soward
(74) *Attorney, Agent, or Firm* — Luedeka Neely Group, P.C.

(57) ABSTRACT

The present invention provides a display, including: a panel including a bending area and two non-bending areas disposed on opposite sides of the bending area; and a first metal sheet and a second metal sheet respectively disposed on the two non-bending areas, wherein an end portion of at least one of the first metal sheet and the second metal sheet close to the bending area has a blunt structure.

17 Claims, 1 Drawing Sheet

DISPLAY HAVING A BLUNT STRUCTURE

BACKGROUND OF INVENTION

Field of Invention

The invention relates to a display technology, in particular to a display, which has a structural design for preventing a metal layer material from scratching a panel.

Description of Prior Art

Organic light-emitting diode (OLED) folding screens are the hottest technology in the display industry today. In order to meet the user's good experience and the aesthetics of the product itself, it pursues thinning in the research of both screen in-folding and out-folding. For products that need to be folded out, a back of the panel needs a metal layer material to support and reduce waviness. In order to achieve the purpose of thinning, although an existing back plate made of a material such as polyimide (PI) or polyethylene (PE) has a supporting effect, it is difficult to reduce the occurrence of wrinkles, so the use of the back plates has been excluded. While only a thin stainless steel (SUS) material is used as the metal layer for the back of the panel, since the metal layer is thinner and sharp, it easily scratches the panel during pad bending.

In order to solve the problem of the conventional light-emitting diode (OLED) folding screen that the metal layer is easy to scratch the panel during pad bending, there is an urgent need to develop a novel display having a structural design for preventing a metal layer material from scratching a panel.

SUMMARY OF INVENTION

In view of this, the present invention provides a display. By blunting an edge of a metal sheet to provide a blunt structure which can prevent the sharp metal sheet from scratching a panel during pad bending, thereby improving a yield of pad bending in a module manufacturing process.

Therefore, according to an embodiment of the present invention, the present invention provides a display, including: a panel including a bending area and two non-bending areas disposed on opposite sides of the bending area; and a first metal sheet and a second metal sheet respectively disposed on the two non-bending areas, wherein an end portion of at least one of the first metal sheet and the second metal sheet close to the bending area has a blunt structure.

In an embodiment of the present invention, a side of the first metal sheet close to the bending area is provided with a support plate integrally formed with the first metal sheet, so that the side of the first metal sheet close to the bending area has an increased thickness to form the blunt structure.

In an embodiment of the present invention, the second metal sheet is provided with an adhesive material integrally formed with the second metal sheet, and the adhesive material covers an upper side and a lower side of the second metal sheet.

In an embodiment of the present invention, each of end portions of the first metal sheet and the second metal sheet close to the bending area has the blunt structure.

In an embodiment of the present invention, the blunt structure is adjacent to an upper surface of the panel.

In an embodiment of the present invention, an upper side and a lower side of each of end portions of the first metal sheet and the second metal sheet close to the bending area have the blunt structure.

In an embodiment of the present invention, the blunt structure is a chamfered structure.

In an embodiment of the present invention, the panel is an organic light emitting diode panel, and the display further includes a touch panel, a polarizer, and a coating, which are sequentially arranged on the panel corresponding the first metal sheet from top to bottom.

In an embodiment of the present invention, the display further includes a circuit trace electrically connected to the second metal sheet.

In an embodiment of the present invention, when the display is bent, the second metal sheet is located above the first metal sheet.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these drawings without paying creative work.

DETAILED DESCRIPTION OF PREFERRED EMBODIMENTS

Figure 1:
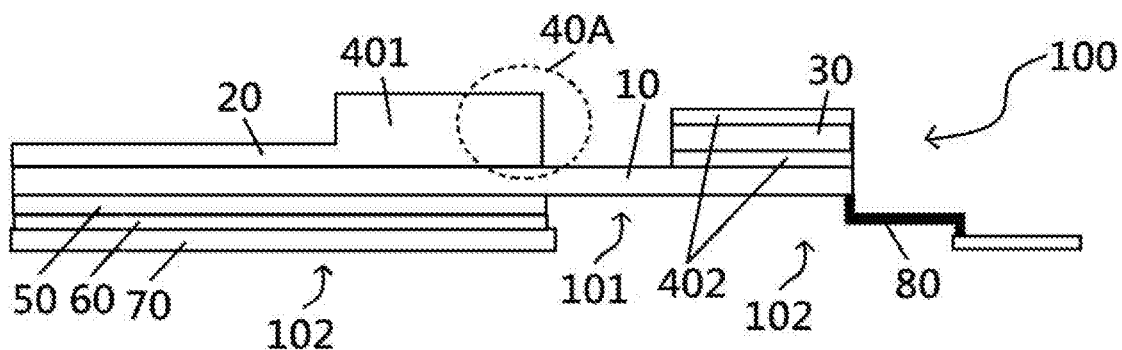
FIG. 1 is a schematic diagram of a display according to an embodiment of the present invention.

In order to make the above description of the present invention more comprehensible, the preferred embodiments are described below in detail with reference to the accompanying drawings.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals.

The present invention provides a display. By blunting an edge of a metal sheet to provide a blunt structure which can prevent the sharp metal sheet from scratching a panel during pad bending, thereby improving a yield of pad bending in a module manufacturing process.

Embodiment 1

According to Embodiment 1 of the present invention, the present invention provides a display 100. Please refer to FIG. 1, which is a schematic diagram of a display according to an embodiment of the present invention. As shown in FIG. 1, specifically, the display 100 provided by an embodiment of the present invention includes: a panel 10 including a bending area 101 and two non-bending areas 102 disposed on opposite sides of the bending area 101; and a first metal sheet 20 and a second metal sheet 30 respectively disposed on the two non-bending areas 102, wherein an end portion of at least one of the first metal sheet 101 and the second metal sheet 102 close to the bending area 101 has a blunt structure 40A.

As shown in FIG. 1, in Embodiment 1 of the present invention, a side of the first metal sheet 20 close to the bending area 101 is provided with a support plate 401 integrally formed with the first metal sheet 20, so that the side of the first metal sheet 20 close to the bending area 101 has an increased thickness to form the blunt structure 40A. The second metal sheet 30 is provided with an adhesive material 402 integrally formed with the second metal sheet 30, and the adhesive material 402 covers an upper side and a lower side of the second metal sheet 30.

In this embodiment, the first metal sheet 20 is integrated with the support plate 401 to increase the thickness to a blunt portion; and the second metal sheet 30 is integrated with the adhesive material 402, such that the bending area 101 of the panel 10 is prevented from being scratched by edges of the first metal sheet 20 and the second metal sheet 30 during pad bending, and a support plate stacking process is eliminated.

Embodiment 2

Figure 2:
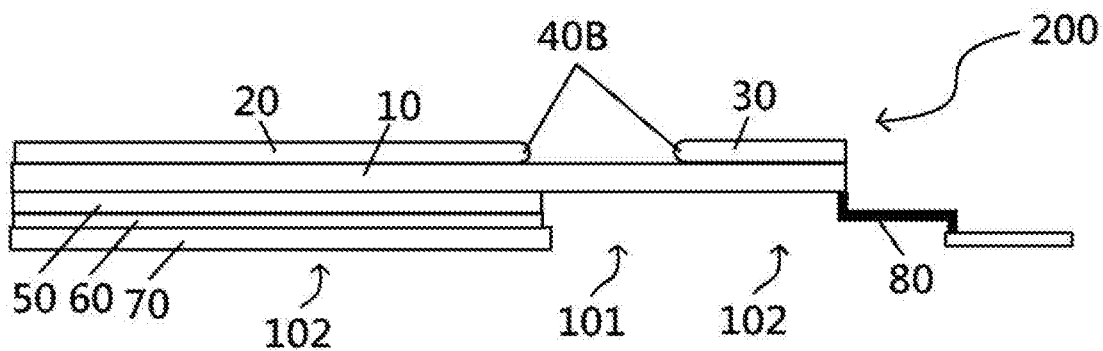
FIG. 2 is a schematic diagram of a display according to another embodiment of the present invention.

According to Embodiment 2 of the present invention, the present invention provides a display 200. Please referring to FIG. 2, which is a schematic diagram of a display according to another embodiment of the present invention. As shown in FIG. 2, specifically, the display 200 provided by an embodiment of the present invention includes: a panel 10 including a bending area 101 and two non-bending areas 102 disposed on opposite sides of the bending area 101; and a first metal sheet 20 and a second metal sheet 30 respectively disposed on the two non-bending areas 102, wherein an end portion of at least one of the first metal sheet 101 and the second metal sheet 102 close to the bending area 101 has a blunt structure 40A.

As shown in FIG. 2, in Embodiment 2 of the present invention, each of end portions of the first metal sheet 20 and the second metal sheet 30 close to the bending area 101 has the blunt structure 40B.

As shown in FIG. 2, in Embodiment 2 of the present invention, the blunt structure 40B is adjacent to an upper surface of the panel.

As shown in FIG. 2, in Embodiment 2 of the present invention, an upper side and a lower side of each of end portions of the first metal sheet 20 and the second metal sheet 30 close to the bending area 101 have the blunt structure 40B.

As shown in FIG. 2, in Embodiment 2 of the present invention, the blunt structure 40B is a chamfered structure.

Referring to FIG. 1 and FIG. 2, in the above-mentioned Embodiment 1 and Embodiment 2, the panel is an organic light emitting diode panel, and the display further includes a touch panel 50, a polarizer 60, and a coating 70, which are sequentially arranged on the panel corresponding the first metal sheet 20 from top to bottom.

Still referring to FIG. 1 and FIG. 2, in the foregoing Embodiment 1 and Embodiment 2, the display further includes a circuit trace 80 electrically connected to the second metal sheet 30.

Figure 3:
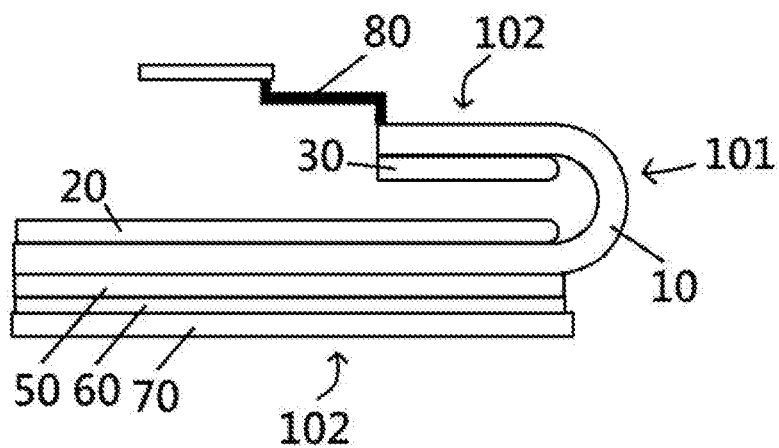
FIG. 3 is a schematic diagram of a display after pad bending according to an embodiment of the present invention.

Referring to FIG. 3, which is a schematic diagram of a display after pad bending according to an embodiment of the present invention. As shown in FIG. 3, specifically, in Embodiments 1 and 2 of the present invention, when the display is bent, the second metal sheet 30 is located above the first metal sheet 20.

Accordingly, the present invention provides a display. By blunting an edge of a metal sheet to provide a blunt structure which can prevent the sharp metal sheet from scratching a panel during pad bending, thereby improving a yield of pad bending in a module manufacturing process.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display, comprising:
a panel comprising a bending area and two non-bending areas disposed on opposite sides of the bending area; and
a first metal sheet and a second metal sheet respectively disposed on the two non-bending areas, wherein an end portion of at least one of the first metal sheet and the second metal sheet close to the bending area has a blunt structure, and a side of the first metal sheet close to the bending area is provided with a support plate integrally formed with the first metal sheet, so that the side of the first metal sheet close to the bending area has an increased thickness to form the blunt structure.

2. The display according to claim 1, wherein the second metal sheet is provided with an adhesive material integrally formed with the second metal sheet, and the adhesive material covers an upper side and a lower side of the second metal sheet.

3. The display according to claim 1, wherein each of end portions of the first metal sheet and the second metal sheet close to the bending area has the blunt structure.

4. The display according to claim 1, wherein the blunt structure is adjacent to an upper surface of the panel.

5. The display according to claim 1, wherein an upper side and a lower side of each of end portions of the first metal sheet and the second metal sheet close to the bending area have the blunt structure.

6. The display according to claim 1, wherein the panel is an organic light emitting diode panel, and the display further comprises a touch panel, a polarizer, and a coating, which are sequentially arranged on the panel corresponding the first metal sheet from top to bottom.

7. The display according to claim 6, wherein the display further comprises a circuit trace electrically connected to the second metal sheet.

8. The display according to claim 1, wherein when the display is bent, the second metal sheet is located above the first metal sheet.

9. A display, comprising:
a panel comprising a bending area and two non-bending areas disposed on opposite sides of the bending area; and
a first metal sheet and a second metal sheet respectively disposed on the two non-bending areas, wherein an end portion of at least one of the first metal sheet and the second metal sheet close to the bending area has a blunt structure, the blunt structure is a chamfered structure, and a cross section of the blunt structure has a rounded edge.

10. The display according to claim 9, wherein a side of the first metal sheet close to the bending area is provided with a support plate integrally formed with the first metal sheet, so that the side of the first metal sheet close to the bending area has an increased thickness to form the blunt structure.

11. The display according to claim 10, wherein the second metal sheet is provided with an adhesive material integrally formed with the second metal sheet, and the adhesive material covers an upper side and a lower side of the second metal sheet.

12. The display according to claim 9, wherein each of end portions of the first metal sheet and the second metal sheet close to the bending area has the blunt structure.

13. The display according to claim 9, wherein the blunt structure is adjacent to an upper surface of the panel.

14. The display according to claim 9, wherein an upper side and a lower side of each of end portions of the first metal sheet and the second metal sheet close to the bending area have the blunt structure.

15. The display according to claim 9, wherein the panel is an organic light emitting diode panel, and the display further comprises a touch panel, a polarizer, and a coating, which are sequentially arranged on the panel corresponding the first metal sheet from top to bottom.

16. The display according to claim 9, wherein the display further comprises a circuit trace electrically connected to the second metal sheet.

17. The display according to claim 9, wherein when the display is bent, the second metal sheet is located above the first metal sheet.

\* \* \* \* \*